United States Patent [19]
Torgeson et al.

[11] Patent Number: 5,986,505
[45] Date of Patent: Nov. 16, 1999

[54] CIRCULAR STRIPLINE PACKAGE INCORPORATING A MMIC LOW NOISE AMPLIFIER

[75] Inventors: George P. Torgeson; John J. Halliday; Allen H. Gordon, all of Tucson, Ariz.

[73] Assignee: Raytheon Company, Lexington, Mass.

[21] Appl. No.: 08/819,796

[22] Filed: Mar. 18, 1997

[51] Int. Cl.[6] ............................................. H03F 3/19
[52] U.S. Cl. ............................................. 330/286; 330/307
[58] Field of Search ............................. 330/53, 286, 287, 330/307; 333/247, 250

[56] References Cited

U.S. PATENT DOCUMENTS 3,651,434 3/1972 McGeough et al. ..................... 333/247

*Primary Examiner*—James B. Mullins
*Attorney, Agent, or Firm*—David W. Collins; Leonard A. Alkov; Glenn H. Lenzen, Jr.

[57] ABSTRACT

A circular low noise amplifier package having an X-band MMIC low noise amplifier disposed therein, that may be preferably used with an existing stripline receiver board employed in a missile. The package has three input/output ports symmetrically located around the package, including DC bias, RF input, and RF output ports. The package mounts directly into the stripline receiver board as a drop-in replacement for an isolator used in the existing stripline receiver board. The circular low noise amplifier package comprises a top cover, an upper RF gasket, a package lid, a hermetic low noise amplifier module containing a low noise amplifier chip, a lower RF gasket, and a bottom cover. The amplifier module has feedthrough pins that extend through the outer wall thereof and couple to the low noise amplifier chip. The top and bottom covers are used to secure the amplifier package to the stripline receiver board. The upper and lower RF gaskets aid in improving an RF ground. The package lid is seam sealed to the amplifier module to hermetically seal the entire package.

15 Claims, 4 Drawing Sheets

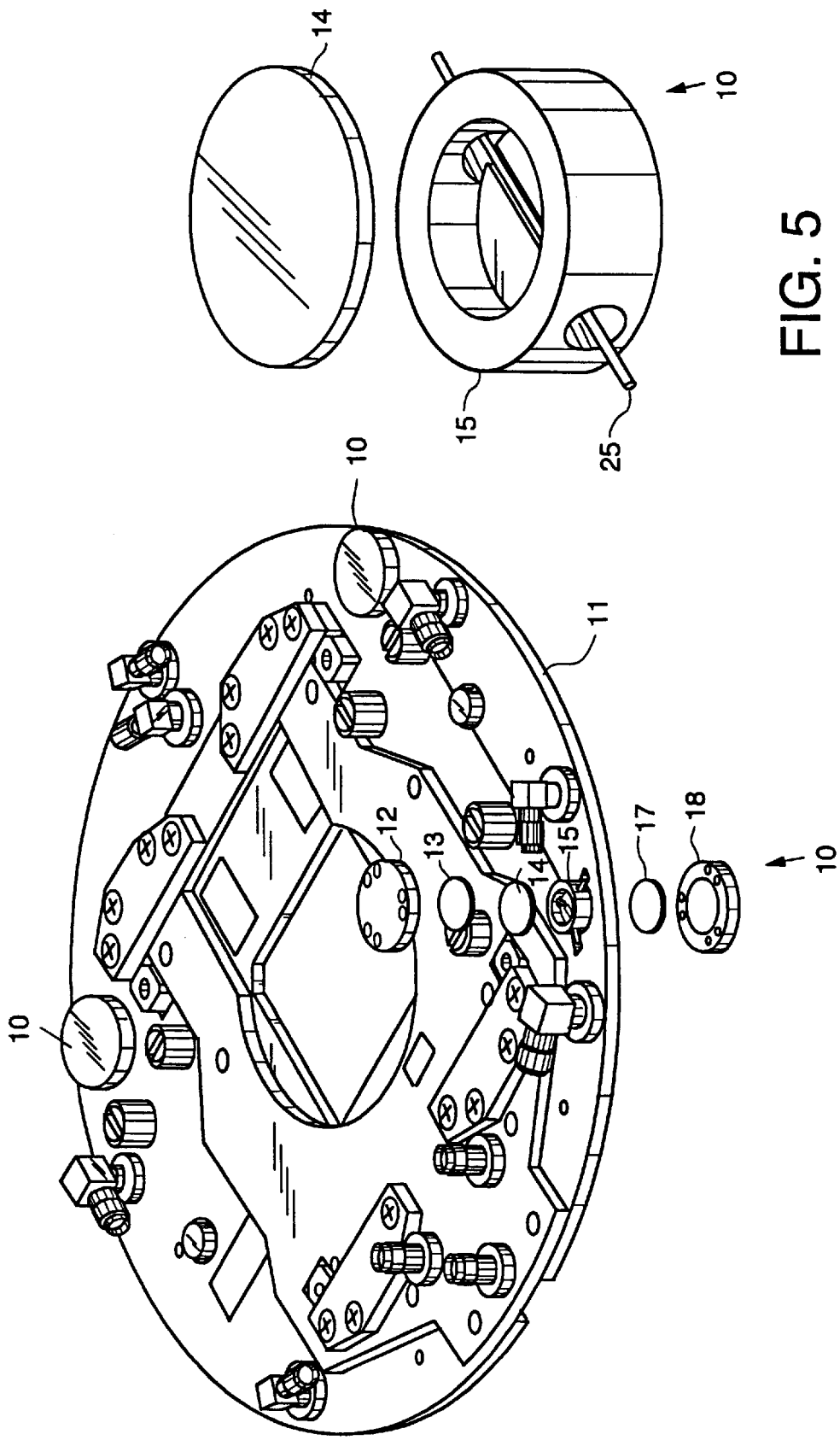

CIRCULAR STRIPLINE PACKAGE INCORPORATING A MMIC LOW NOISE AMPLIFIER

BACKGROUND

This invention was made with Government support under Contract No. N00024-95-C-5400 awarded by Department of the Navy. The Government has certain rights in this invention.

The present invention relates generally to amplifiers for use in missile receivers, and the like, and more particularly, to circular low noise amplifier package comprising a circular stripline package incorporating a MMIC low noise amplifier that significantly improves the sensitivity of such missile receivers.

The assignee of the present invention designs and manufactures missile systems, and in particular designs and manufactures receivers for use in seekers of such missiles. In order to improve the performance of the missile receiver and missile seeker used in a semi-active radar guided missile, for example, a missile receiver manufactured by the assignee of the present invention was the subject of studies to determine how to improve its sensitivity. Various approaches were investigated that would meet improved receiver requirements. The existing receiver is embodied in a stripline receiver circuit board that contains three channels, including DC bias, RF input, and RF output channels. There were two other approaches that were investigated for providing the required receiver improvement that drove the design of the present invention.

The first approach uses a low noise amplifier in combination with an image reject mixer. This design uses the low noise amplifier at an RF input that feeds into the image reject mixer. Due to design constraints of the existing design, a local oscillator (LO) signal to the mixer requires amplification. This is necessary to meet output compression point and third order intercept point requirements. The LO input to the mixer must be set up to provide AM noise cancellation on the LO line. The RF amplifier must be able to meet input VSWR requirements. Finally, an IF output stage must meet output VSWR requirements. It was found that this first design could only be implemented using a rectangular or multi-sided package. This first design required extensive modification of the existing stripline receiver circuit board. The circuit board had to be modified to include stripline cut-outs that house the rectangular or multi-sided package that contains the low noise amplifier and image reject mixer circuitry. The stripline artwork had to be redesigned to accommodate the low noise amplifier and image reject mixer and a new LO distribution network. The new LO distribution network required phase adjustment during test to balance its three channels. Consequently, this design had added cost and increased risk.

The second approach had a low noise amplifier packaged in a square or rectangular housing, with connectors mounted on sides thereof Using a package with connectors mounted on the sides would not meet the low noise requirement due to excessive losses through the connectors. These losses can be reduced by using a package with 12 mil pins in glass feedthough mountings disposed through sides of the housing, but this approach still required stripline cut-outs in the stripline receiver circuit board to house the low noise amplifier plus modifications to the artwork on the board (RF traces need to be moved to accommodate the new package). The second approach is less expensive and has a lower element of risk than the first approach, but its performance was less than desirable.

Accordingly, it is an objective of the present invention to provide for a low noise amplifier package that may be used with a stripline receiver that significantly improves the sensitivity of the receiver and that overcomes the limitations of the approaches outlined above.

SUMMARY OF THE INVENTION

To meet the above and other objectives, the present invention provides a circular low noise amplifier package that has an X-band MMIC low noise amplifier mounted in an X-band circular microwave package, particularly adapted for use with an existing stripline receiver board employed in a missile. The package has three input/output ports, symmetrically located around the package. The package mounts directly into an existing stripline circuit board as a drop-in replacement for an existing isolator.

The circular low noise amplifier package comprises a circular top lid or cover, a circular upper RF gasket, a circular Kovar package lid, a circular hermetic low noise amplifier module, a circular lower RF gasket, and a circular bottom lid or cover. The circular hermetic low noise module has 12 mil feedthrough pins that are coupled to a low noise amplifier chip contained therein. The top and bottom covers are used to mechanically secure the circular low noise amplifier package to the stripline receiver board. The upper and lower RF gaskets are used to improve the RF ground. The Kovar lid is seam sealed to the low noise amplifier package to provide a hermetic seal for the circular low noise amplifier package.

The primary advantage of the present invention is the simplicity of its design. The use of the present low noise amplifier package only requires the addition of a DC bias line to the stripline board. Three circular low noise amplifier packages are located at three existing isolator locations. All existing RF circuitry remains intact, and no expensive redesign of the stripline circuit board is required. This design approach does not require extensive testing and phase adjustments to balance the RF paths for each of the three channels in the receiver. This is due to the use of closely matched low noise amplifier packages that connect to the existing circuit board. Thus, no new artwork is required. The present invention thus provides a low risk solution that improves missile receiver sensitivity by 6 dB.

The low noise amplifier package of the present invention requires no modifications to the stripline circuit board. Optimization of the circular low noise amplifier package allows it to outperform other package technologies. The performance of the low noise amplifier package was optimized for X-band frequencies from 9 to 11 GHz. The addition of the circularly packaged MMIC low noise amplifier to the stripline receiver board has improved the receiver sensitivity by more than 6 dB. The performance of a typical conventional package exhibits a return loss of approximately 20 dB, an insertion loss of greater than 0.1 dB and a transition loss of greater than 0.1 dB. The performance of the present low noise amplifier package has a return loss of better than 24 dB, an insertion loss of less than 0.1 dB, and a transition loss of less than 0.05 dB.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 4 is an isometric view of the circular low noise amplifier package and illustrates components located above and below the stripline receiver board prior to assembly;

FIG. 5 shows the circular low noise amplifier package with a 50 ohm feedthrough.

DETAILED DESCRIPTION

Figure 1:
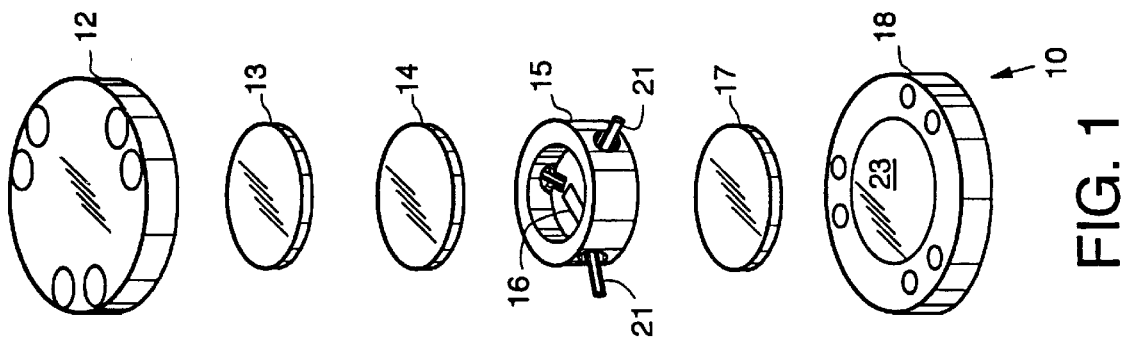
FIG. 1 illustrates an exploded isometric view of a circular low noise amplifier package in accordance with the principles of the present invention.

Referring to the drawing figures, FIGS. 1–6 show details of a circular low noise amplifier package 10 in accordance with the principles of the present invention and its installation into a stripline receiver board 11 (FIG. 4) that may be preferably used in a missile (not shown), for example. Referring to FIG. 1, it shows an isometric view of the circular low noise amplifier package 10. The circular low noise amplifier package 10 comprises a circular top lid 12 or cover 12, a circular upper RF gasket 13, a circular package lid 14, which may be comprised of Kovar, for example, a circular hermetic low noise amplifier module 15 containing a low noise amplifier chip 16, such as an X-band MMIC low noise amplifier chip 16, a circular lower RF gasket 17, and a circular bottom lid 18 or cover 18. As is well-known, Kovar is an alloy of iron, nickel, and cobalt. The hermetic low noise amplifier module 15 has three 12-mil feedthrough pins 21 that extend through the outer wall thereof and couple to the low noise amplifier chip 16. The top and bottom covers 12, 18 mechanically secure the circular low noise amplifier package 10 to the stripline receiver board 11. The upper and lower RF gaskets 13, 17 aid in improving the RF ground. The Kovar package lid 14 is seam sealed to the low noise amplifier module 15 to hermetically seal the entire circular low noise amplifier module 15.

Figure 2:
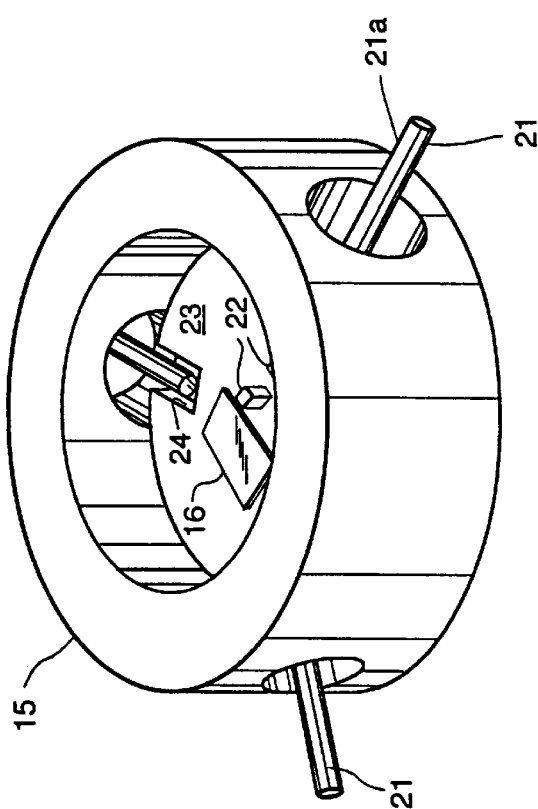
FIG. 2 illustrates an enlarged view of the module of FIG. 1.

FIG. 2 is an enlarged view of the circular low noise amplifier package 10 showing the low noise amplifier chip 16 and two bypass capacitors 22 mounted on a base 23 thereof. The 12 mil pin 21 pointing to the lower right hand corner is a DC bias pin 21a. The DC bias pin 21a is attached to the low noise amplifier chip 16 using 0.007 mil gold wire, for example, which is bonded to the two bypass capacitors 22, in series, and then to the DC input of the low noise amplifier chip 16. The other two pins 21 provide a path for an RF input and an RF output, via 0.007 mil gold wire.

Figure 3:
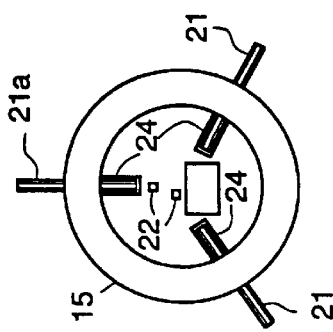
FIG. 3 shows a top view of the module of FIG. 1.

FIG. 3 shows a top view of the circular low noise amplifier module 15. This view shows the relative location of the low noise amplifier chip 16 and two bypass capacitors 22. The symmetry of the three pins 21 is also displayed in this view. This view also shows the location of the feed through pins 21. Ends of the RF input and output pins 21 are positioned as close to the low noise amplifier chip 16 as possible. A half circular channel 24 is used to house each pin within the hermetic low noise amplifier module 15 and is dimensioned to create the required impedance match to the stripline receiver board 11.

FIG. 4 is an isometric view of the circular low noise amplifier module 15 and illustrates components thereof that are located above and below the stripline receiver board 11 prior to assembly. Two additional circular low noise amplifier packages 10 are shown fully installed on the stripline receiver board 11. The circular low noise amplifier package 10 is installed into one of the three channels of the stripline receiver board 11. In an actual installation, the Kovar lid is seam sealed to the low noise amplifier module prior to installation of the circular low noise amplifier package 10 into the stripline receiver board 11. The pins 21 or leads 21 of the circular low noise amplifier package 10 are soldered to exposed stripline traces and then the upper and lower RF gaskets 13, 17 are secured in place. Lastly, the upper and lower covers 12, 18 are secured in place.

FIG. 5 shows an embodiment of the circular low noise amplifier module 15 employing a 50 ohm feedthrough 25. This embodiment of the circular low noise amplifier module 15 was used to characterize insertion loss through the module 15 and allowed optimization of the input and output VSWR of the module 15.

The present circular low noise amplifier package 10 was tested at a chip level, a package level, at a receiver board level, and at system level. At the chip level, the performance of the low noise amplifier chip 16 was verified, and was as stated by the chip manufacturer. At the package level, tests were performed to verify the design of the circular low noise amplifier package 10 and verify that it did not degrade the performance of the low noise amplifier chip 16. At the receiver board level, tests were performed to verify that the performance of the circular low noise amplifier package 10 met all receiver board level requirements. At system level, tests were performed to verify system level requirements were met. The chip level tests showed that the chip 16 met stated requirements of the chip manufacturer. The tests of the circular low noise amplifier package 10 showed that the design met the requirements that were established for this type of design and did not degrade the performance of the low noise amplifier chip 16. The receiver board level tests and system level tests showed that the circular low noise amplifier package 10 installed into the stripline receiver board 11 met all requirements of the receiver and system for the missile.

Figure 6:
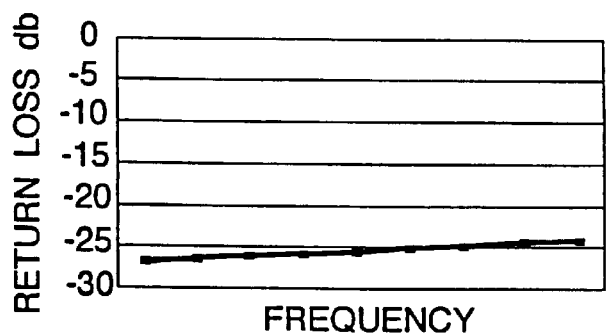
FIGS. 6–12 show detailed test data at each level of testing of the circular low noise amplifier package.
Figure 7:
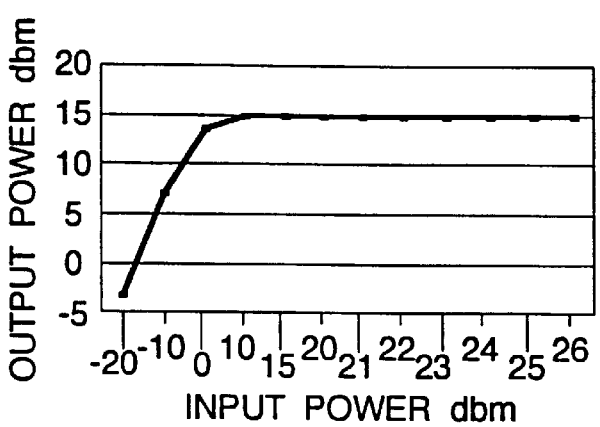

More specifically, FIGS. 6–12 show detailed test data at each level of testing of the circular low noise amplifier package 10. FIG. 6 shows the that the return loss of the module 15 is better than 24 dB and that the insertion loss is less than 0.1 dB. The coax to microstrip transition loss was measured at less than 0.05 dB. This results in an excellent electrical package for low noise amplifier applications. FIG. 7 shows the results of a high power survival test. This test shows that the low noise amplifier chip 16 can survive an input power up to ±26 dBm. This eliminates the requirement for a pin diode limiter in front of the low noise amplifier chip 16 and improves the overall noise figure performance of the circular low noise amplifier package 10.

Figure 8:
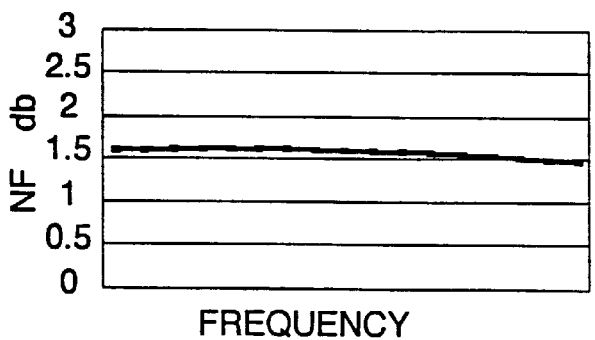

FIG. 8 shows noise figure performance of the low noise amplifier chip 16 used in the circular low noise amplifier package 10. The noise figure is typically between 1.5 and 1.6 dB, which agrees with manufacturer's data and verifies performance of the chip 16.

Figure 9:
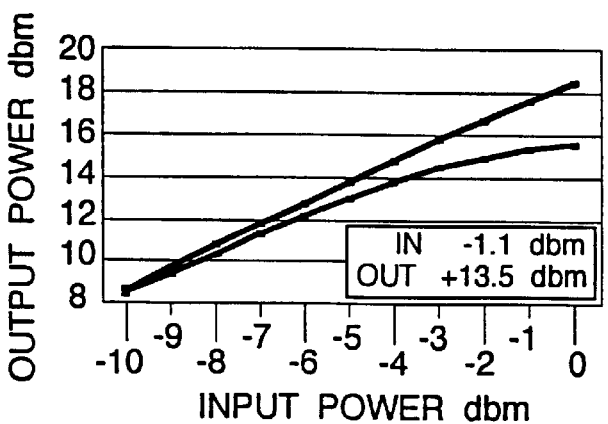

FIG. 9 shows a 1 dB compression point of the circular low noise amplifier package 10. This performance meets system level requirements, allowing the use of the circular low noise amplifier package 10 in the existing receiver board 11 without modification. The input compression point of the first mixer in the receiver is approximately −1 dBm and output compression of the low noise amplifier module 15 is at approximately +13 dBm.

Figure 10:
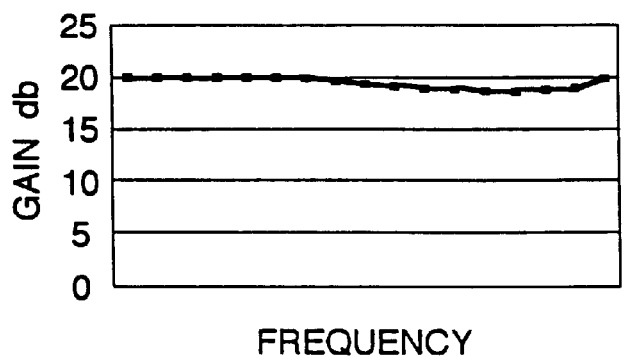
Figure 11:
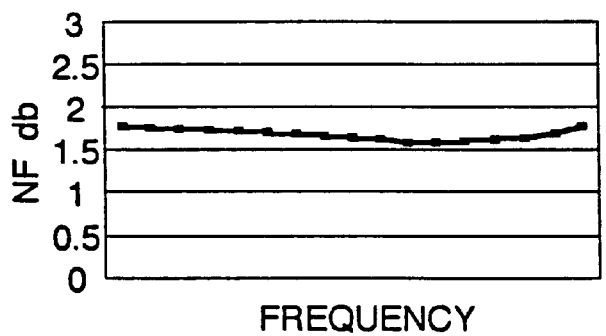

FIGS. 10 and 11 show RF gain and noise figure performance, respectively, of the circular low noise amplifier module 15 tested in the stripline receiver. This test data verifies the performance of the circular low noise amplifier package 10 at receiver board level.

Figure 12:
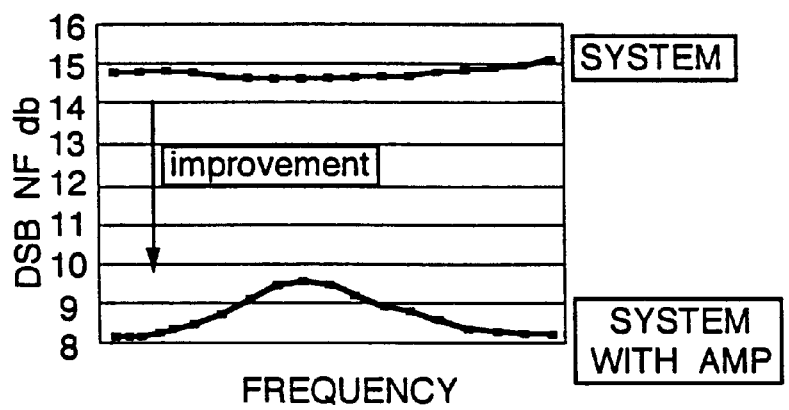

FIG. 12 shows test results of the circular low noise amplifier package 10 employed in a seeker system (the antenna, mono pulse network, gimbal platform, the receiver board 11, and low noise amplifier packages 10). The plot is a comparison of the seeker system without and with the circular low noise amplifier package 10 in the circuit. The rise in the middle of the frequency plot when using the low noise amplifier package 10 in the system is due a YIG filter that is in front of the low noise amplifier package 10. This is an out-of-band response where the YIG filter is not required to operate. The system performs over two frequency bands separated by approximately 200 MHz.

The circular low noise amplifier package 10 was tested at a guidance section level to verify the required 6 dB improvement from the previous specification level. This test showed seeker acquisition at approximately 7 dB better than the specification, thus demonstrating the required improvement provided by the present invention with considerable margin.

Thus, a low noise amplifier package that may be used with a stripline receiver that significantly improves the sensitivity of the receiver has been disclosed. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. Circular stripline package comprising:
   a circular top cover;
   a circular upper RF gasket;
   a circular package lid;
   a circular low noise amplifier module containing a low noise amplifier chip and having a plurality of feedthrough pins that extend through an outer wall of the module and are coupled to the low noise amplifier chip;
   a circular lower RF gasket; and
   a circular bottom cover.

2. The apparatus of claim 1 wherein the upper and lower RF gaskets improve an RF ground for the circular low noise amplifier module.

3. The apparatus of claim 1 wherein the circular low noise amplifier module comprises a circular hermetic low noise amplifier module.

4. The apparatus of claim 1 further comprising a stripline receiver board, and wherein the apparatus is mechanically secured to the stripline receiver board by means of the top and bottom covers.

5. The apparatus of claim 1 wherein the circular package lid is seam sealed to the low noise amplifier module to hermetically seal the circular low noise amplifier module.

6. The apparatus of claim 1 wherein the circular package lid comprises an alloy of iron, nickel, and cobalt.

7. The apparatus of claim 6 wherein the circular package lid is seam sealed to the low noise amplifier module to hermetically seal the circular low noise amplifier module.

8. Apparatus comprising:
   a stripline receiver comprising a stripline receiver circuit board that comprises a DC bias input, an RF input, and an RF output; and
   three circular low noise amplifier stripline packages coupled to the stripline receiver circuit board, wherein each of said packages comprises:
   a circular top cover;
   a circular upper RF gasket;
   a circular package lid;
   a circular low noise amplifier module containing a low noise amplifier chip and having a plurality of feedthrough pins that extend through an outer wall of the module and are coupled to the low noise amplifier chip;
   a circular lower RF gasket; and
   a circular bottom cover.

9. The apparatus of claim 8 wherein the DC bias input is series coupled by way of two bypass capacitors to a DC bias input of the low noise amplifier chip.

10. The apparatus of claim 8 wherein the upper and lower RF gaskets improve an RF ground for the hermetic low noise amplifier module.

11. The apparatus of claim 8 wherein the circular low noise amplifier module comprises a circular hermetic low noise amplifier module.

12. The apparatus of claim 8 wherein the apparatus is mechanically secured to the stripline receiver circuit board by means of the top and bottom covers.

13. The apparatus of claim 8 wherein the circular package lid is seam sealed to the low noise amplifier module to hermetically seal the circular low noise amplifier module.

14. The apparatus of claim 8 wherein the circular package lid comprises an alloy of iron, nickel, and cobalt.

15. The apparatus of claim 14 wherein the circular package lid is seam sealed to the low noise amplifier module to hermetically seal the circular low noise amplifier module.

* * * * *